(12) United States Patent
Bak et al.

(10) Patent No.: US 11,342,495 B2
(45) Date of Patent: May 24, 2022

(54) MAGNETIC MEMORY DEVICES FOR REDUCING ELECTRICAL SHORTS BETWEEN MAGNETIC TUNNEL JUNCTION PATTERNS

(71) Applicant: Samsung Electronics Co., Ltd., Suwon-si (KR)

(72) Inventors: Junghoon Bak, Suwon-si (KR); Woojin Kim, Hwaseong-si (KR); Junghwan Moon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 16/789,525

(22) Filed: Feb. 13, 2020

(65) Prior Publication Data

US 2021/0005806 A1    Jan. 7, 2021

(30) Foreign Application Priority Data

Jul. 5, 2019 (KR) .................. 10-2019-0081509

(51) Int. Cl.
*H01L 43/02* (2006.01)
*H01L 43/12* (2006.01)
*H01F 10/32* (2006.01)
*H01L 43/10* (2006.01)

(52) U.S. Cl.
CPC .............. *H01L 43/02* (2013.01); *H01L 43/12* (2013.01); *H01F 10/329* (2013.01); *H01F 10/3286* (2013.01); *H01L 43/10* (2013.01)

(58) Field of Classification Search
CPC ......... H01L 43/02; H01L 43/12; H01L 43/10; H01F 10/3286; H01F 10/329
USPC ........................................................ 257/421
See application file for complete search history.

(56) References Cited

U.S. PATENT DOCUMENTS

| | | | |
|---|---|---|---|
| 8,120,126 | B2 | 2/2012 | Lee et al. |
| 8,198,692 | B2 | 6/2012 | Nikonov et al. |
| 9,812,507 | B2 | 11/2017 | Komura et al. |
| 10,038,136 | B2 | 7/2018 | Chung et al. |
| 2006/0174473 | A1* | 8/2006 | Oh .................. G11C 11/16 29/603.08 |
| 2011/0177666 | A1 | 7/2011 | Nozawa |
| 2015/0092481 | A1* | 4/2015 | Lee .................. G11C 11/15 365/158 |
| 2018/0061467 | A1 | 3/2018 | Kan et al. |
| 2018/0205004 | A1 | 7/2018 | Park et al. |
| 2019/0036014 | A1 | 1/2019 | Ha |

FOREIGN PATENT DOCUMENTS

| | | |
|---|---|---|
| JP | 4763858 | 8/2011 |
| KR | 1020190011461 | 2/2019 |

* cited by examiner

*Primary Examiner* — Jami Valentine Miller

(74) *Attorney, Agent, or Firm* — Myers Bigel, P.A.

(57) ABSTRACT

Magnetic memory devices may include a substrate, a metal pattern extending in a first direction on the substrate, a magnetic tunnel junction pattern on the metal pattern, and an anti-oxidation layer between the metal pattern and the magnetic tunnel junction pattern. The magnetic tunnel junction pattern may include a first magnetic pattern, a tunnel barrier pattern, and a second magnetic pattern.

20 Claims, 17 Drawing Sheets

MAGNETIC MEMORY DEVICES FOR REDUCING ELECTRICAL SHORTS BETWEEN MAGNETIC TUNNEL JUNCTION PATTERNS

CROSS-REFERENCE TO RELATED APPLICATION

This U.S. non-provisional patent application claims priority under 35 U.S.C. § 119 to Korean Patent Application No. 10-2019-0081509, filed on Jul. 5, 2019, in the Korean Intellectual Property Office, the disclosure of which is hereby incorporated by reference in its entirety.

BACKGROUND

Embodiments of the inventive concepts relate to a magnetic memory device and, more particularly, to a magnetic memory device including a magnetic tunnel junction pattern and a method of manufacturing the same.

High-speed and low-voltage memory devices have been demanded to realize high-speed and low-power electronic devices including memory devices. A magnetic memory device has been studied as a memory device satisfying these demands. The magnetic memory device has been spotlighted as a next-generation memory device because of its high-speed operation characteristic and/or non-volatile characteristic.

A magnetic memory device uses a magnetic tunnel junction (MTJ). The magnetic tunnel junction may include two magnetic layers and an insulating layer disposed between the two magnetic layers, and a resistance of the magnetic tunnel junction may be changed according to magnetization directions of the two magnetic layers. In detail, the magnetic tunnel junction may have a high resistance when the magnetization directions of the two magnetic layers are anti-parallel to each other. In contrast, the magnetic tunnel junction may have a low resistance when the magnetization directions of the two magnetic layers are parallel to each other. The magnetic memory device may write/read data by using a difference between the resistances of the magnetic tunnel junction.

SUMMARY

Embodiments of the inventive concepts may provide a spin-orbit torque-based magnetic memory device capable of high integration.

Embodiments of the inventive concepts may also provide a method of manufacturing a magnetic memory device with improved reliability.

According to some embodiments of the inventive concepts, magnetic memory devices may include a substrate, a metal pattern extending in a first direction on the substrate, a magnetic tunnel junction pattern on the metal pattern, and an anti-oxidation layer between the metal pattern and the magnetic tunnel junction pattern. The magnetic tunnel junction pattern may include a first magnetic pattern, a tunnel barrier pattern, and a second magnetic pattern.

According to some embodiments of the inventive concepts, magnetic memory device may include a substrate, a metal pattern extending in a first direction on the substrate, and a plurality of magnetic tunnel junction patterns. Each of the plurality of magnetic tunnel junction patterns may include a respective one of a plurality of first magnetic patterns, a respective one of a plurality of tunnel barrier patterns and a respective one of a plurality of second magnetic patterns. The magnetic memory devices may also include an anti-oxidation layer between the metal pattern and the plurality of first magnetic patterns. The plurality of magnetic tunnel junction patterns may be spaced apart from each other, and the anti-oxidation layer may extend in the first direction and may be electrically connected to the plurality of the first magnetic patterns.

BRIEF DESCRIPTION OF THE DRAWINGS

The inventive concepts will become more apparent in view of the attached drawings and accompanying detailed description.

DETAILED DESCRIPTION

Magnetic memory devices and methods of manufacturing the same according to some embodiments of the inventive concepts will be described more fully hereinafter with reference to the accompanying drawings.

Figure 1:
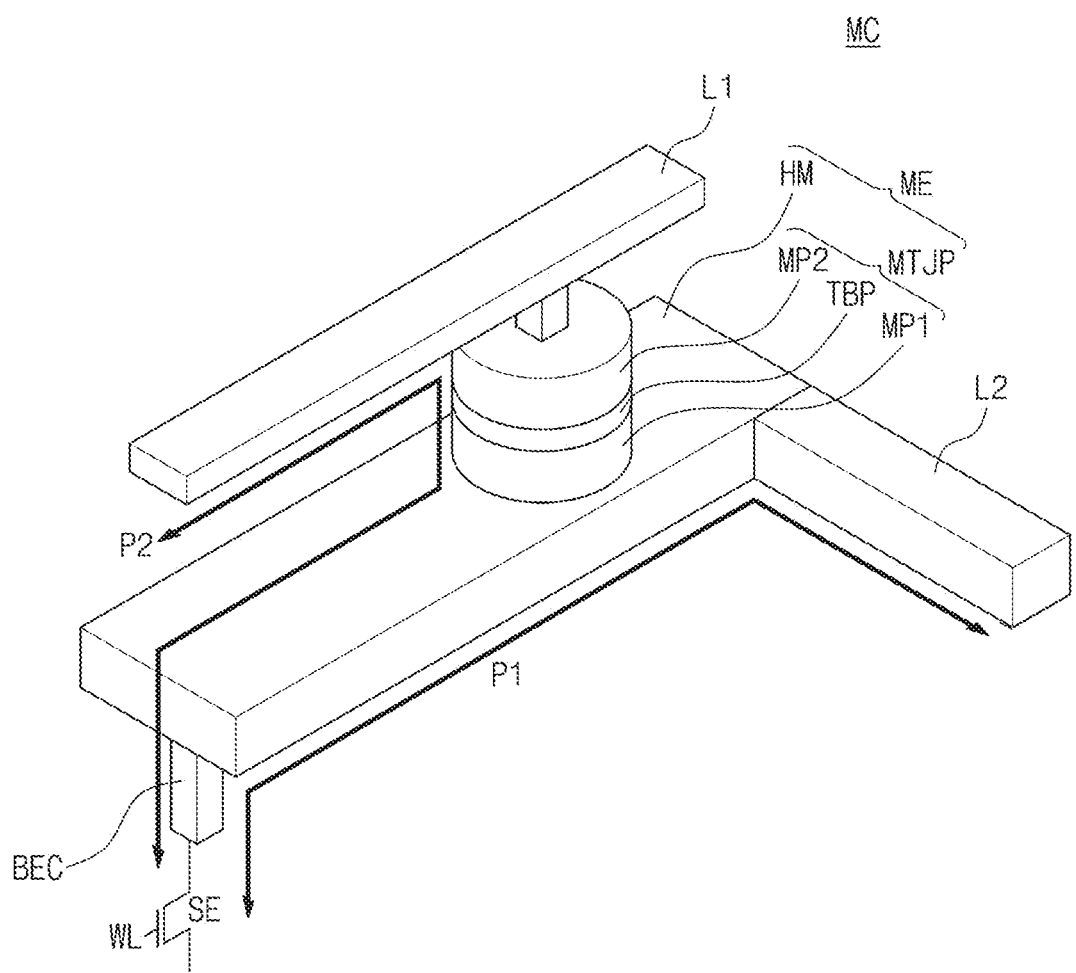
FIG. 1 is a conceptual view illustrating a unit memory cell of a magnetic memory device according to some embodiments of the inventive concepts.

FIG. 1 is a conceptual view illustrating a unit memory cell of a magnetic memory device according to some embodiments of the inventive concepts.

Referring to FIG. 1, a unit memory cell MC may include a word line WL, a read line L1, a write line L2, a memory element ME, and a selection element SE. The memory element ME may be connected between the read line L1 and the selection element SE. The memory element ME may be electrically connected in series to the read line L1 and the selection element SE. The read line L1 and the word line WL may intersect each other when viewed in a plan view. A plurality of the unit memory cells MC may be two-dimensionally or three-dimensionally arranged. The plurality of unit memory cells MC may be two-dimensionally or three-dimensionally arranged to constitute a memory cell array. The memory cell array may be connected to a decoder and a driver.

Hereinafter, a single memory element ME will be described. The memory element ME may be a variable resistance element of which a resistance state is switchable between two different resistance states by an electrical pulse applied thereto. The memory element ME may have a thin layer structure. An electrical resistance of the memory element ME may be changed using a spin-orbit torque (SOT) by a current. The memory element ME may include at least one ferromagnetic material and/or at least one antiferromagnetic material.

In some embodiments, the memory element ME may include a magnetic tunnel junction pattern MTJP and a metal pattern HM. The magnetic tunnel junction pattern MTJP may include a first magnetic pattern MP1, a tunnel barrier pattern TBP, and a second magnetic pattern MP2. One of the first and second magnetic patterns MP1 and MP2 may be a free pattern of which a magnetization direction is freely changeable by a flow of a current, and the other of the first and second magnetic patterns MP1 and MP2 may be a pinned pattern which has a magnetization direction fixed regardless of the flow of the current.

For example, the first magnetic pattern MP1 being in contact with the metal pattern HM may be the free pattern, and the second magnetic pattern MP2 spaced apart from the metal pattern HM may be the pinned pattern. Hereinafter, for the purpose of ease and convenience in explanation, the first magnetic pattern MP1 will be described as the free pattern, and the second magnetic pattern MP2 will be described as the pinned pattern. An electrical resistance of the magnetic tunnel junction pattern MTJP may be dependent on the magnetization directions of the free pattern and the pinned pattern. For example, an electrical resistance of the magnetic tunnel junction pattern MTJP when the magnetization directions of the free and pinned patterns are anti-parallel to each other may be much higher than that of the magnetic tunnel junction pattern MTJP when the magnetization directions of the free and pinned patterns are parallel to each other. In other words, the electrical resistance of the magnetic tunnel junction pattern MTJP may be adjusted by changing the magnetization direction of the free pattern. Data may be stored in the unit memory cell MC by using a difference between the electrical resistances of the magnetic tunnel junction pattern MTJP.

To change the magnetization direction of the free pattern of the magnetic tunnel junction pattern MTJP, a current may flow through a first path P1. The first path P1 may include a path in a direction substantially parallel to a top surface of the free pattern. The first path P1 may be a path from the selection element SE toward the write line L2 through a bottom electrode contact BEC and the metal pattern HM. Alternatively, the first path P1 may be a path from the write line L2 toward the selection element SE through the metal pattern HM and the bottom electrode contact BEC.

When the current flows through the first path P1, a spin hall effect (SHE) and a Rashba effect (RE) may occur by spin-orbit coupling of electrons in the metal pattern HM. The spin-orbit coupling may mean coupling of spins and orbit motions of the electrons. The spin hall effect (SHE) may be a principle similar to the hall effect and may mean an effect in which spins are accumulated on a surface of a conductor by the spin-orbit coupling. The Rashba effect (RE) may mean an effect in which a state of an electron spin of a non-magnetic body is changed by a potential difference. The Rashba effect (RE) may be enhanced by asymmetry of an interface between the metal pattern HM and the free pattern. The spin hall effect (SHE) and the Rashba effect (RE) may accumulate spin-polarized electrons in a place close to the free pattern. The accumulated electrons may apply spin-orbit torque (SOT) to the free pattern. In other words, when a current of a certain magnitude or more flows through the metal pattern HM, the spin-orbit torque (SOT) applied to the free pattern may change the magnetization direction of the free pattern. To change the magnetization direction of the free pattern, a current having a current density value of a critical current density ($J_c$) or more may flow through the metal pattern HM. A write operation may be performed through the process of changing the magnetization direction of the free pattern. In other words, data may be stored through the process of changing the magnetization direction of the free pattern.

A current may flow through a second path P2 to read the data stored through the process of changing the magnetization direction of the free pattern. The second path P2 may include a path in a direction substantially perpendicular to the top surface of the free pattern. The second path P2 may be a path from the read line L1 toward the selection element SE through the magnetic tunnel junction pattern MTJP and the metal pattern HM. When the current flows through the second path P2, a resistance difference of the magnetic tunnel junction pattern MTJP may be measured. A read operation may be performed by the current flowing through the magnetic tunnel junction pattern MTJP.

The selection element SE may be configured to selectively control a flow of a current. For example, the selection element SE may be a diode, a PNP bipolar transistor, an NPN bipolar transistor, an NMOS field effect transistor, or a PMOS field effect transistor. When the selection element SE is the diode of a two-terminal element, one of the illustrated lines may be omitted. The method of connecting the selection element SE to the memory element ME in FIG. 1 is illustrated as an example. However, embodiments of the inventive concepts are not limited thereto. In some embodiments, the selection element SE may be connected to the memory element ME by another method.

Figure 2A:
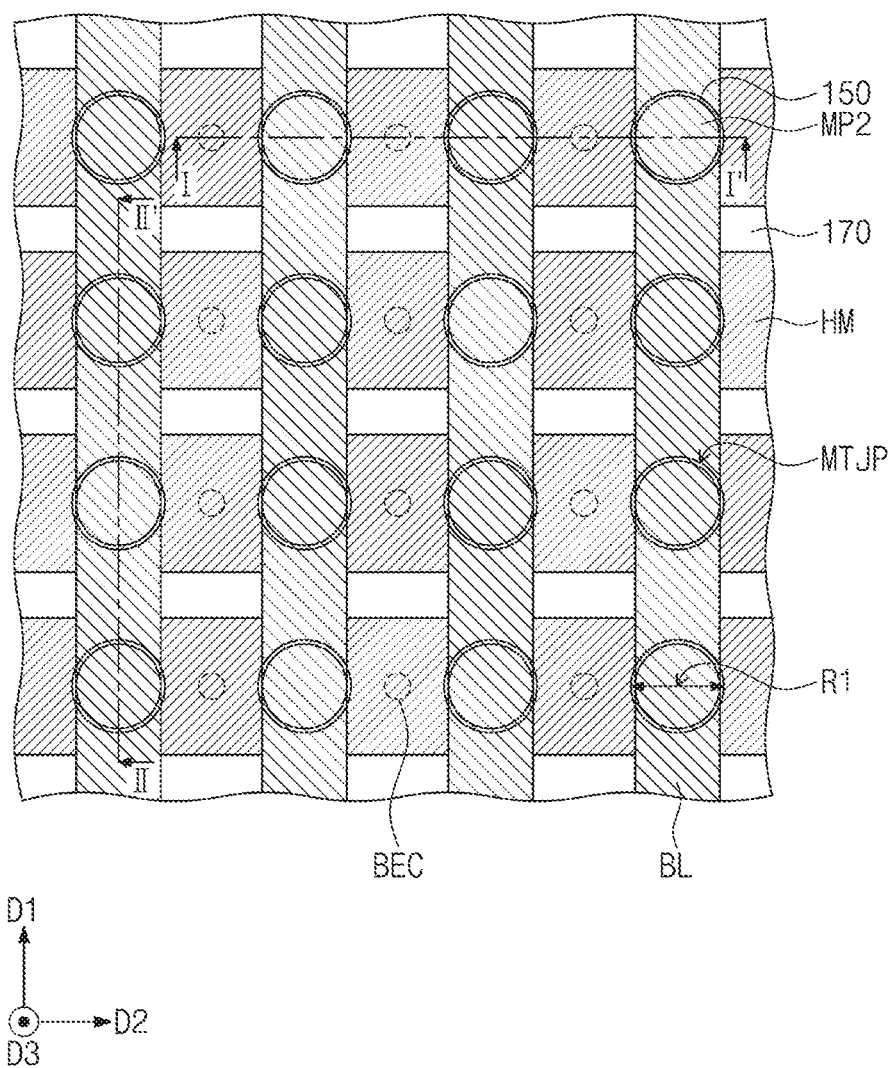
FIGS. 2A, 3A, 4A, 5A, 6A, 7A, 8A, and 9A are plan views illustrating magnetic memory devices and methods of manufacturing the same, according to some embodiments of the inventive concepts.
Figure 2B:
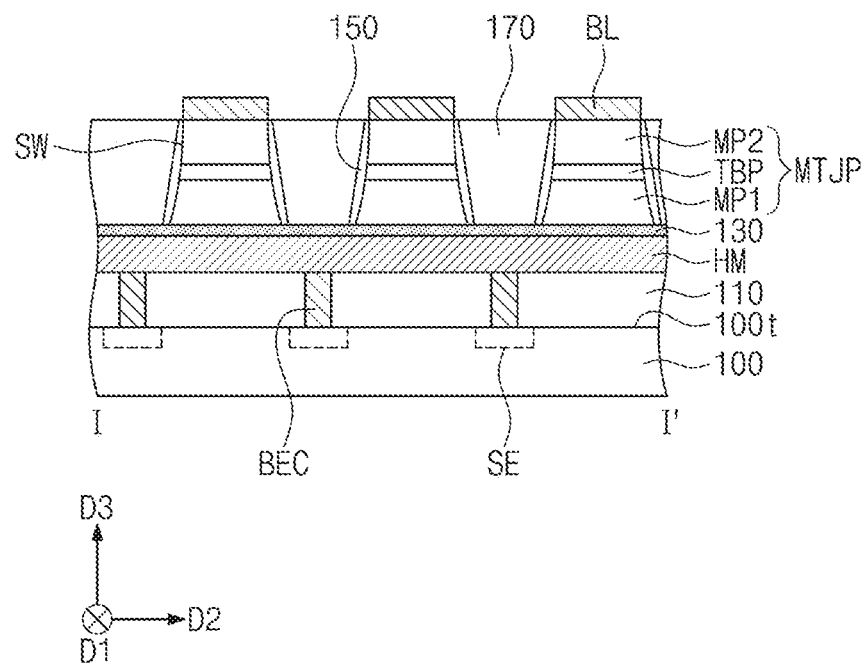
FIGS. 2B, 3B, 4B, 5B, 6B, 7B, 8B, and 9B are cross-sectional views taken along lines I-I' of FIGS. 2A to 9A, respectively, to illustrate magnetic memory devices and methods of manufacturing the same, according to some embodiments of the inventive concepts.
Figure 2C:
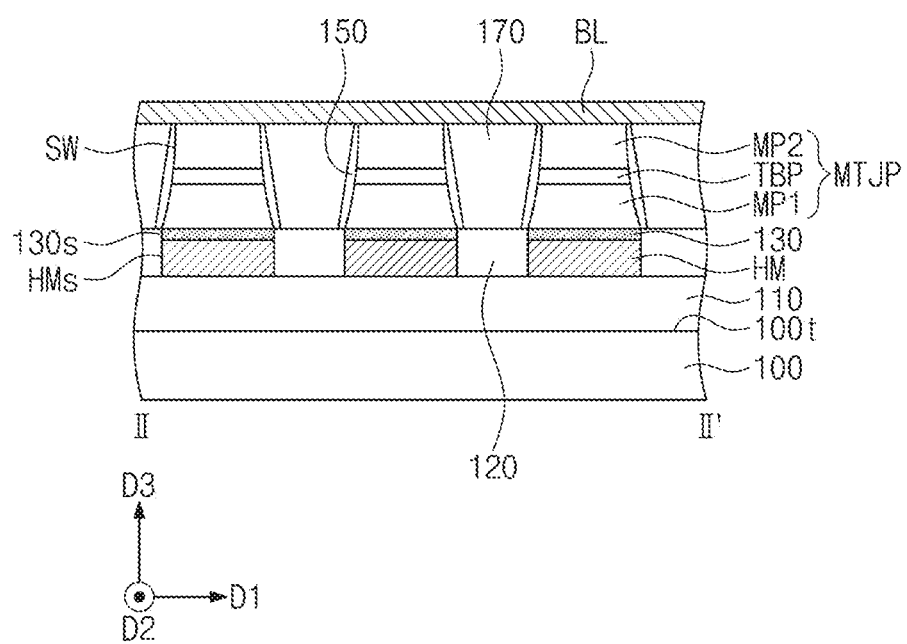
FIGS. 2C, 3C, 4C, 5C, 6C, and 7C are cross-sectional views taken along lines II-II' of FIGS. 2A to 7A, respectively, to illustrate magnetic memory devices and methods of manufacturing the same, according to some embodiments of the inventive concepts.

FIG. 2A is a plan view illustrating a memory cell array of a magnetic memory device according to some embodiments of the inventive concepts. FIGS. 2B and 2C are cross-sectional views taken along lines I-I' and II-II' of FIG. 2A, respectively.

Referring to FIGS. 2A, 2B and 2C, a first insulating pattern 110 and bottom electrode contacts BEC in the first insulating pattern 110 may be provided on a substrate 100. A plurality of selection elements SE may be in the substrate 100. The substrate 100 may include a semiconductor substrate. For example, the substrate 100 may include a silicon (Si) substrate, a germanium (Ge) substrate, or a silicon-germanium (SiGe) substrate. Each of the selection elements SE may be, for example, a diode or a transistor. Unlike FIG. 2B, in some embodiments, each of the selection elements SE may include a source pattern, a drain pattern, and a gate pattern. Each of the source pattern, the drain pattern and the gate pattern may include a conductive material such as a metal, a conductive oxide, or doped silicon. The first insulating pattern 110 may include, for example, silicon oxide, silicon nitride, silicon oxynitride, and/or a low-k material. For example, the low-k material may include silicon oxyhydrocarbon (SiOCH) or porous silicon oxyhydrocarbon (porous SiOCH). As used herein the term "and/or" includes any and all combinations of one or more of the associated listed items.

The bottom electrode contacts BEC may be provided in the first insulating pattern 110. The bottom electrode contacts BEC may penetrate the first insulating pattern 110 to extend from a bottom surface to a top surface of the first insulating pattern 110 in a third direction D3. The third direction D3 may be a direction perpendicular to a top surface 100t of the substrate 100. Each of the bottom electrode contacts BEC may be electrically connected to one of the selection elements SE disposed in the substrate 100. For example, each of the bottom electrode contacts BEC may be electrically connected to the source pattern or the drain pattern of each of the selection elements SE. In some embodiments, unlike FIG. 2B, the bottom electrode contacts BEC may not be connected to the selection elements SE disposed in the substrate 100 but may be electrically connected to at least one of interconnection lines. The bottom electrode contacts BEC may include at least one of a metal (e.g., titanium, tantalum, and/or tungsten), a conductive metal nitride (e.g., titanium nitride and/or tantalum nitride), a semiconductor material doped with dopants (e.g., doped silicon, doped germanium, and/or doped silicon-germanium), or a metal-semiconductor compound (e.g., a metal silicide). In some embodiments, the bottom surface and the top surface of the first insulating pattern 110 may be parallel to the top surface 100t of the substrate 100. The top surface 100t of the substrate 100 may face the magnetic tunnel junction pattern MTJP. The third direction D3 may be a vertical direction.

A second insulating pattern 120, a metal pattern HM in the second insulating pattern 120, and an anti-oxidation layer 130 may be provided on the first insulating pattern 110 and the bottom electrode contacts BEC. The second insulating pattern 120 may include, for example, silicon oxide, silicon nitride, silicon oxynitride, and/or a low-k material. For example, the second insulating pattern 120 may include substantially the same material as the first insulating pattern 110. The metal pattern HM may extend in a second direction D2 and may be electrically connected to a plurality of the bottom electrode contacts BEC. In some embodiments, the metal pattern HM may extend longitudinally in the second direction D2 as illustrated in FIG. 2A. The metal pattern HM extending in the second direction D2 may be provided in plurality, and the metal patterns HM may be spaced apart from each other in a first direction D1. The first direction D1 and the second direction D2 may be perpendicular to the third direction D3. The first direction D1 and the second direction D2 may be perpendicular to each other. The metal pattern HM may include a material that has a great magnitude of spin-orbit coupling when a current flows therethrough. In the event that an atomic number of a material is great (e.g., about 30 or more), the magnitude of the spin-orbit coupling of the material may be great when a current flows therethrough. In other words, the metal pattern HM may include a heavy metal material of which an atomic number is about 30 or more. A current may flow in a direction substantially parallel to a top surface of the metal pattern HM. The current may flow through the metal pattern HM in the second direction D2 or a direction opposite to the second direction D2 to perform a write operation. The metal pattern HM may include, for example, tantalum (Ta), platinum (Pt), bismuth (Bi), titanium (Ti), or tungsten (W). In particular, the metal pattern HM may include tungsten (W). Each of the first direction D1 and the second direction D2 may be a horizontal direction.

The anti-oxidation layer 130 may be provided on the metal pattern HM. The anti-oxidation layer 130 may extend in the second direction D2 on the metal pattern HM. In addition, the anti-oxidation layers 130 on the metal patterns HM may be spaced apart from each other in the first direction D1. A top surface of the anti-oxidation layer 130 may be substantially coplanar with a top surface of the second insulating pattern 120. Like the metal pattern HM, the anti-oxidation layer 130 may include a material that has a great magnitude of spin-orbit coupling when a current flows therethrough. A first region of the anti-oxidation layer 130 may include a heavy metal material of which an atomic number is about 30 or more. The first region of the anti-oxidation layer 130 may include, for example, niobium (Nb) or titanium (Ti). The first region of the anti-oxidation layer 130, which includes the heavy metal material, may be a region overlapped by a first magnetic pattern MP1 in the third direction D3. However, a second region of the anti-oxidation layer 130 may include a metal oxide. For example, the second region of the anti-oxidation layer 130 may include an oxide of niobium (Nb) or an oxide of titanium (Ti). The second region of the anti-oxidation layer 130, which includes the metal oxide, may be a region that is not in contact with the first magnetic pattern MP1. In some embodiments, a thickness of the anti-oxidation layer 130 in the third direction D3 may be less than a thickness of the metal pattern HM in the third direction D3. For example, the thickness of the anti-oxidation layer 130 in the third direction D3 may range from 0.1 nm to 10 nm. In some embodiments, each of the first region of the anti-oxidation layers 130 may directly and physically contact a respective one of the first magnetic patterns MP1, and a single second region of the anti-oxidation layer 130 may be between two immediately adjacent first regions of the anti-oxidation layer 130 as illustrated in FIG. 2B.

A third insulating pattern 170, magnetic tunnel junction patterns MTJP in the third insulating pattern 170, and an oxide layer 150 may be provided on the second insulating pattern 120 and the anti-oxidation layer 130. The third insulating pattern 170 may include an insulating material. For example, the third insulating pattern 170 may include silicon oxide or silicon nitride. A top surface of the third insulating pattern 170 may be substantially coplanar with top surfaces of the magnetic tunnel junction patterns MTJP and a top surface of the oxide layer 150.

A plurality of the magnetic tunnel junction patterns MTJP may be provided on the anti-oxidation layer 130. Even though not shown in the drawings, a seed layer may be disposed between the anti-oxidation layer 130 and the magnetic tunnel junction patterns MTJP. The magnetic tunnel junction patterns MTJP may be spaced apart from each other. The third insulating pattern 170 may be provided in a space between the magnetic tunnel junction patterns MTJP spaced apart from each other. In some embodiments, the third insulating pattern 170 may not be provided. In the case in which the third insulating pattern 170 is not provided, the second insulating pattern 120 and the anti-oxidation layer 130 may be exposed outside of the magnetic memory device. The magnetic tunnel junction patterns MTJP may be arranged to constitute a magnetic tunnel junction array. Here, the magnetic tunnel junction array including two or more magnetic tunnel junction patterns MTJP may be provided on the metal pattern HM and the anti-oxidation layer 130 which extend in the second direction D2. The magnetic tunnel junction patterns MTJP may not be connected directly to each other but may be electrically isolated from each other, and thus each of the magnetic tunnel junction patterns MTJP may independently store data. Hereinafter, a single magnetic tunnel junction pattern MTJP will be described in detail.

The magnetic tunnel junction pattern MTJP may include a first magnetic pattern MP1, a tunnel barrier pattern TBP, and a second magnetic pattern MP2. In some embodiments, the first magnetic pattern MP1 may be a free pattern, and the second magnetic pattern MP2 may be a pinned pattern. In other words, the first magnetic pattern MP1 may have a changeable magnetization direction, and the second magnetic pattern MP2 may have a fixed magnetization direction. A width of the magnetic tunnel junction pattern MTJP in the first direction D1 and/or the second direction D2 may decrease as a distance from the substrate 100 in the third direction D3 increases. However, embodiments of the inventive concepts are not limited thereto. Unlike FIGS. 2B and 2C, the width of the magnetic tunnel junction pattern MTJP in the first direction D1 and/or the second direction D2 may be substantially uniform as a distance from the substrate 100 in the third direction D3 increases. In addition, as illustrated in FIG. 2A, the top surface of the magnetic tunnel junction pattern MTJP may have a circular shape. However, embodiments of the inventive concepts are not limited thereto. Unlike FIG. 2A, the top surface of the magnetic tunnel junction pattern MTJP may have one of other various shapes such as a diamond shape, an elliptical shape, and a rectangular shape. The greatest width (i.e., widest width) in the first direction D1 and/or the second direction D2 at the top surface or a bottom surface of the magnetic tunnel junction pattern MTJP may be less than a width (e.g., a widest width) of the metal pattern HM in the first direction D1.

In some embodiments, the first and second magnetic patterns MP1 and MP2 may have a horizontal magnetization structure in which magnetization directions are substantially parallel to a top surface of the tunnel barrier pattern TBP. In this case, each of the first and second magnetic patterns MP1 and MP2 may include a layer including a ferromagnetic material. For example, each of the first and second magnetic patterns MP1 and MP2 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$. In addition, the second magnetic pattern MP2 may have a multi-layered structure of a layer including an antiferromagnetic material and the layer including the ferromagnetic material. For example, the layer including the antiferromagnetic material may include at least one of PtMn, IrMn, MnO, MnS, MnTe, $MnF_2$, $FeCl_2$, FeO, $CoCl_2$, CoO, $NiCl_2$, NiO, or Cr. In addition, for example, the layer including the antiferromagnetic material may include ruthenium (Ru), rhodium (Rh), palladium (Pd), osmium (Os), iridium (Ir), platinum (Pt), gold (Au), or silver (Ag). For example, the layer including the ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

In some embodiments, the first and second magnetic patterns MP1 and MP2 may have a perpendicular magnetization structure in which magnetization directions are substantially perpendicular to the top surface of the tunnel barrier pattern TBP. In this case, each of the first and second magnetic patterns MP1 and MP2 may include at least one of a material having a $L1_0$ crystal structure, a material having a hexagonal close packed (HCP) lattice structure, or an amorphous rare earth-transition metal (RE-TM) alloy. For example, each of the first and second magnetic patterns MP1 and MP2 may include the material having the $L1_0$ crystal structure, which includes at least one of $Fe_{50}Pt_{50}$, $Fe_{50}Pd_{50}$, $Co_{50}Pt_{50}$, $Co_{50}Pd_{50}$, or $Fe_{50}Ni_{50}$. In some embodiments, each of the first and second magnetic patterns MP1 and MP2 may include a cobalt-platinum (CoPt) disordered alloy having the HCP lattice structure and a platinum (Pt) content of about 10% to about 45%, or a $Co_3Pt$ ordered alloy having the HCP lattice structure. Alternatively, each of the first and second magnetic patterns MP1 and MP2 may include the amorphous RE-TM alloy which includes at least one of iron (Fe), cobalt (Co), or nickel (Ni) and at least one of terbium (Tb), dysprosium (Dy), or gadolinium (Gd). Tb, Dy and Gd may correspond to the rare earth metals.

In some embodiments, each of the first and second magnetic patterns MP1 and MP2 may include a material having interface perpendicular magnetic anisotropy. Magnetic anisotropy means a property that shows a preference for a specific direction when spins are aligned by a magnetic field in a ferromagnetic material. In particular, the interface perpendicular magnetic anisotropy means a property that a magnetic layer having an intrinsic horizontal magnetization property has a perpendicular magnetization direction by an influence of an interface between the magnetic layer and another layer adjacent to the magnetic layer. Here, the intrinsic horizontal magnetization property may mean that a magnetic layer has a magnetization direction parallel to the widest surface of the magnetic layer when an external factor does not exist. For example, when the magnetic layer having the intrinsic horizontal magnetization property is formed on a substrate and an external factor does not exist, the magnetization direction of the magnetic layer may be substantially parallel to a top surface of the substrate. For example, each of the first and second magnetic patterns MP1 and MP2 may include at least one of cobalt (Co), iron (Fe), or nickel (Ni). In addition, each of the first and second magnetic patterns MP1 and MP2 may further include at least one selected from non-magnetic materials including, for example, boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, each of the first and second magnetic patterns MP1 and MP2 may include CoFe or NiFe and may further include boron (B). In addition, to reduce saturation magnetizations of the first and second magnetic patterns MP1 and MP2, each of the first and second magnetic patterns MP1 and MP2 may further include at least one of, for example, titanium (Ti), aluminum (Al), silicon (Si), magnesium (Mg), or tantalum (Ta).

The tunnel barrier pattern TBP may include at least one of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). For example, the tunnel barrier pattern TBP may include a single layer formed of magnesium oxide (MgO). In some embodiments, the tunnel barrier pattern TBP may include a plurality of layers. Oxygen atoms in the tunnel barrier pattern TBP may react with metal atoms (e.g., iron atoms) of the first magnetic pattern MP1 and/or the second magnetic pattern MP2 to improve perpendicular magnetic anisotropy of the first magnetic pattern MP1 and/or the second magnetic pattern MP2. In other words, the tunnel barrier pattern TBP may affect the magnetization direction(s) of the first magnetic pattern MP1 and/or the second magnetic pattern MP2.

Unlike FIGS. 2B and 2C, the magnetic tunnel junction pattern MTJP may further include a polarization enhancement layer in addition to the first magnetic pattern MP1, the tunnel barrier pattern TBP, and the second magnetic pattern MP2. The polarization enhancement layer may be provided between the first magnetic pattern MP1 and the tunnel barrier pattern TBP and/or between the second magnetic pattern MP2 and the tunnel barrier pattern TBP. The polarization enhancement layer may increase a spin polarizability and a magnetoresistance ratio of the magnetic tunnel junction pattern MTJP. Thus, magnetizations of the first and second magnetic patterns MP1 and MP2 may be enhanced. The polarization enhancement layer may include, for example, at least one of iron (Fe), an iron (Fe) alloy having a body centered cubic (BCC) lattice structure, a CoFeB-based amorphous alloy, or an alloy having a $L2_1$ crystal structure.

The oxide layer 150 may cover a sidewall SW of each of the magnetic tunnel junction patterns MTJP on the anti-oxidation layer 130. The oxide layer 150 may include, for example, an oxide of the material(s) included in the magnetic tunnel junction pattern MTJP. In other words, the oxide layer 150 may include an oxide of the material included in the first magnetic pattern MP1, an oxide of the material included in the tunnel barrier pattern TBP, and/or an oxide of the material included in the second magnetic pattern MP2. The top surface of the oxide layer 150 may have substantially the same height in the third direction D3 as the top surface of the magnetic tunnel junction pattern MTJP. In other words, the top surface of the oxide layer 150 may be substantially coplanar with the top surface of the magnetic tunnel junction pattern MTJP. It will be understood that "an element A covering a sidewall of an element B" (or similar language) means that the element A extends on the sidewall of the element B but does not necessarily mean that the element A covers the sidewall of the element B entirely.

Bit lines BL may be provided on the magnetic tunnel junction patterns MTJP, the oxide layer 150, and the third insulating pattern 170. The bit lines BL may extend in the first direction D1 while overlapping centers of the top surfaces of the magnetic tunnel junction patterns MTJP. In some embodiments, a width of the bit line BL in the second direction D2 may be substantially equal to the greatest width of the top surface of the second magnetic pattern MP2 in the second direction D2. In addition, for example, the width of the bit line BL in the second direction D2 may be less than the greatest width R1, in the second direction D2, of a top surface of a pillar including the oxide layer 150 and the magnetic tunnel junction pattern MTJP. In some embodiments, unlike FIGS. 2B and 2C, an insulating layer in which top electrodes and/or top electrode contacts electrically connected to the magnetic tunnel junction patterns MTJP are disposed may be provided between the bit lines BL and the magnetic tunnel junction patterns MTJP. In this case, the bit lines BL may be electrically connected to the top electrodes or the top electrode contacts. A current flowing through the bit line BL may vertically pass through the top surface of the magnetic tunnel junction pattern MTJP and may flow toward the metal pattern HM, and thus a read operation may be performed.

Figure 3A:
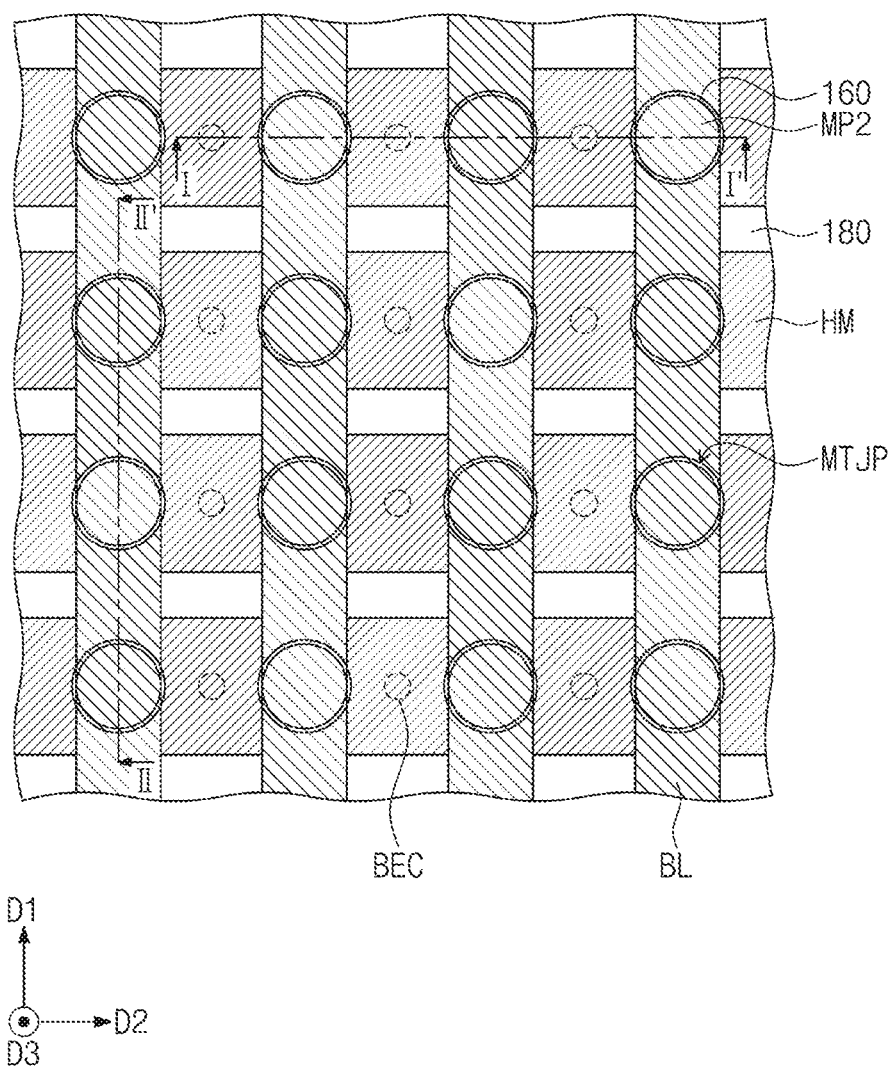
Figure 3B:
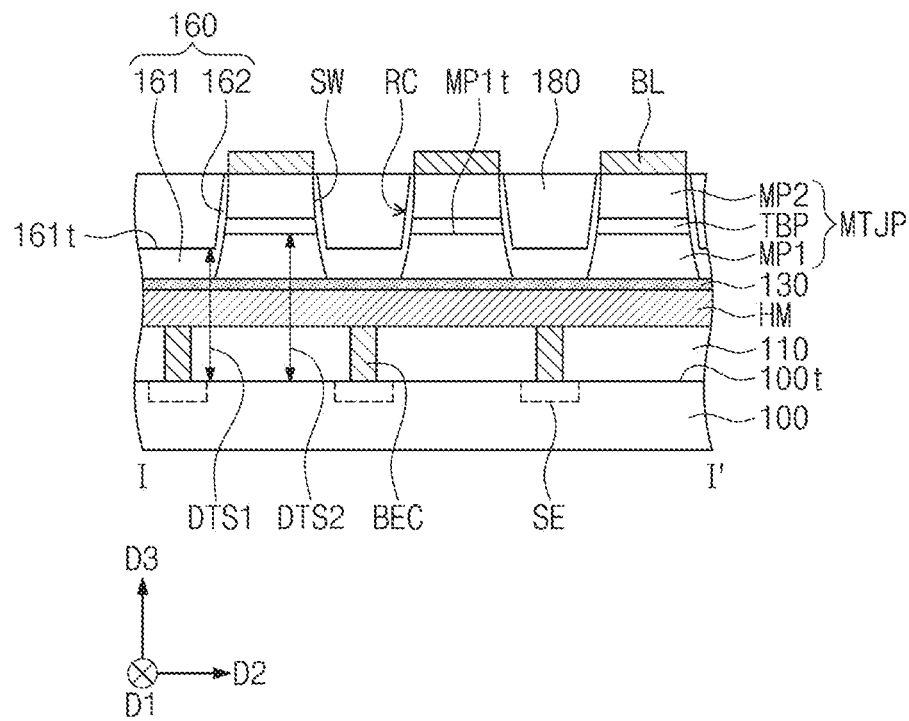
Figure 3C:
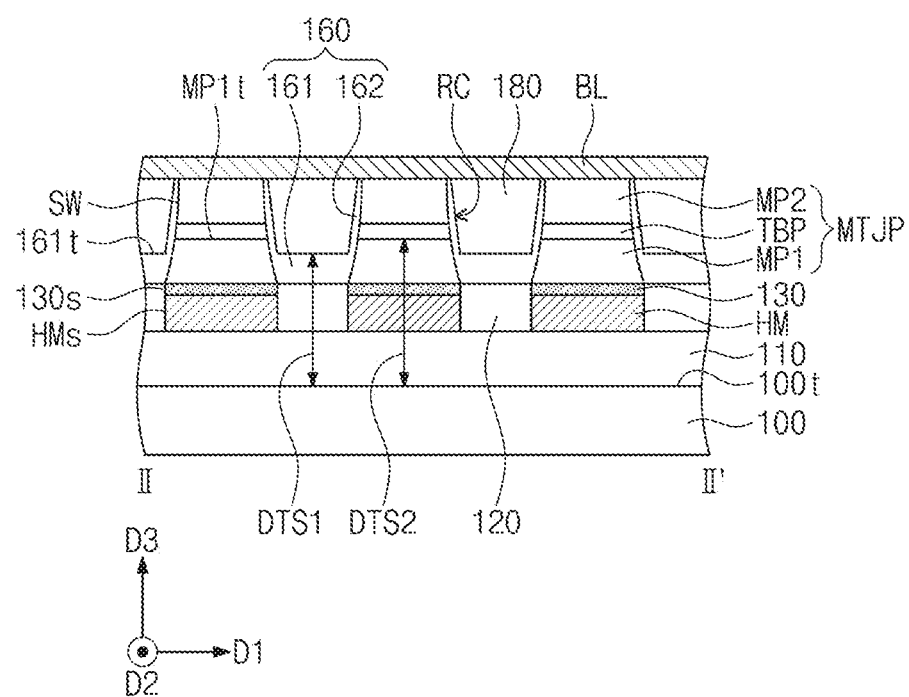

FIG. 3A is a plan view illustrating a memory cell array of a magnetic memory device according to some embodiments of the inventive concepts. FIGS. 3B and 3C are cross-sectional views taken along lines I-I' and II-II' of FIG. 3A, respectively. Hereinafter, the descriptions of the same components and/or features as in the embodiments of FIGS. 2A, 2B and 2C may be omitted for the purpose of ease and convenience in explanation.

Referring to FIGS. 3A, 3B and 3C, an oxide layer 160 may be provided to cover the top surface of the second insulating pattern 120, the top surface of the anti-oxidation layer 130, and the sidewalls SW of the magnetic tunnel junction patterns MTJP. The oxide layer 160 may include a first portion 161, a second portion 162, and a recess region RC. The recess region RC of the oxide layer 160 may be defined by the first portion 161 and the second portion 162. The first portion 161 of the oxide layer 160 may be provided on the top surface of the anti-oxidation layer 130. A height of the first portion 161 of the oxide layer 160 in the third direction D3 may be equal to or lower than a height of the first magnetic pattern MP1 in the third direction D3. The second portion 162 of the oxide layer 160 may cover the sidewalls SW of the magnetic tunnel junction patterns MTJP. In more detail, the second portion 162 of the oxide layer 160 may cover sidewalls of the tunnel barrier pattern TBP and the second magnetic pattern MP2. A top surface of the second portion 162 of the oxide layer 160 may be substantially coplanar with a top surface of the second magnetic pattern MP2. The oxide layer 160 may be provided to prevent the second insulating pattern 120, the anti-oxidation layer 130 and the magnetic tunnel junction patterns MTJP from being exposed. The oxide layer 160 may have a shape of a cross section of a hollow pillar having a closed bottom end. In some embodiments, a top surface 161$t$ of the first portion 161 of the oxide layer 160 may be spaced apart from the top surface 100$t$ of the substrate 100 by a first distance DTS1 in the third direction D3, a top surface MP1$t$ of the first magnetic pattern MP1 may be spaced apart from the top surface 100$t$ of the substrate 100 by a second distance DTS2 in the third direction D3, and the second distance DTS2 may be greater than the first distance DTS1 as illustrated in FIG. 3B.

A third insulating pattern 180 may be provided on the oxide layer 160. The third insulating pattern 180 may include an insulating material. For example, the third insulating pattern 180 may include, for example, silicon oxide or silicon nitride. The third insulating pattern 180 may fill (e.g., partially or completely fill) the recess region RC of the oxide layer 160. In some embodiments, the third insulating pattern 180 may not be provided.

The bit lines BL may be provided on the magnetic tunnel junction patterns MTJP, the second portion 162 of the oxide layer 160, and the third insulating pattern 180. The bit lines BL may extend in the first direction D1.

Figure 4A:
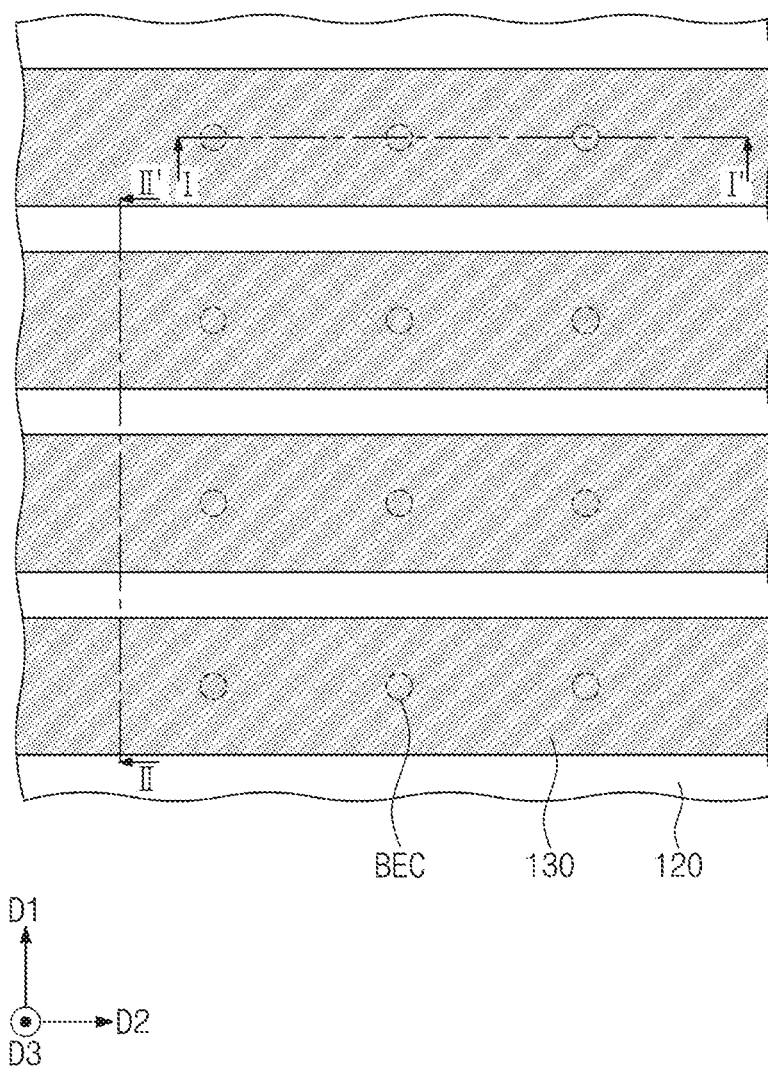
Figure 4B:
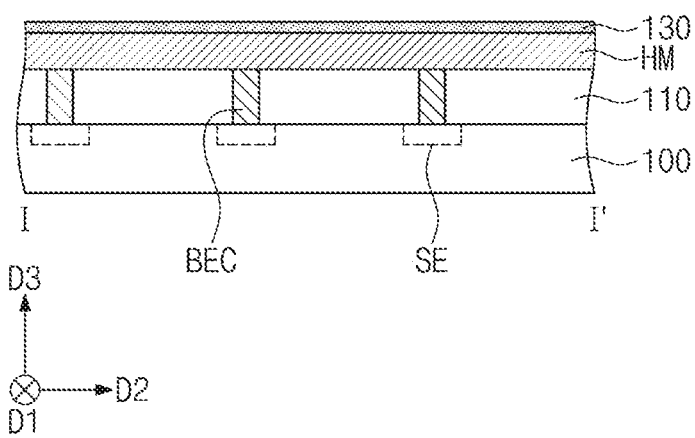
Figure 4C:
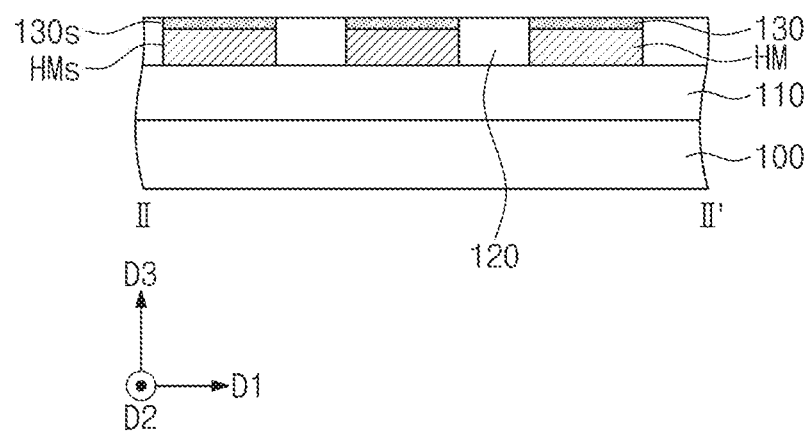
Figure 5A:
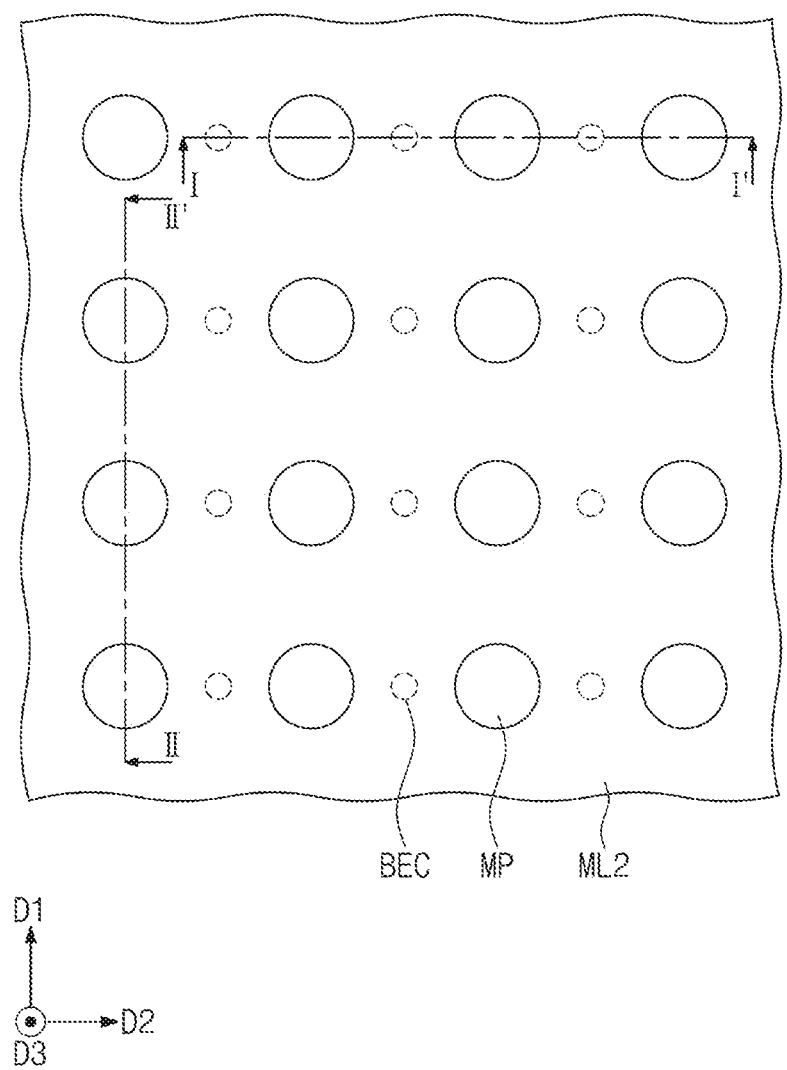
Figure 5B:
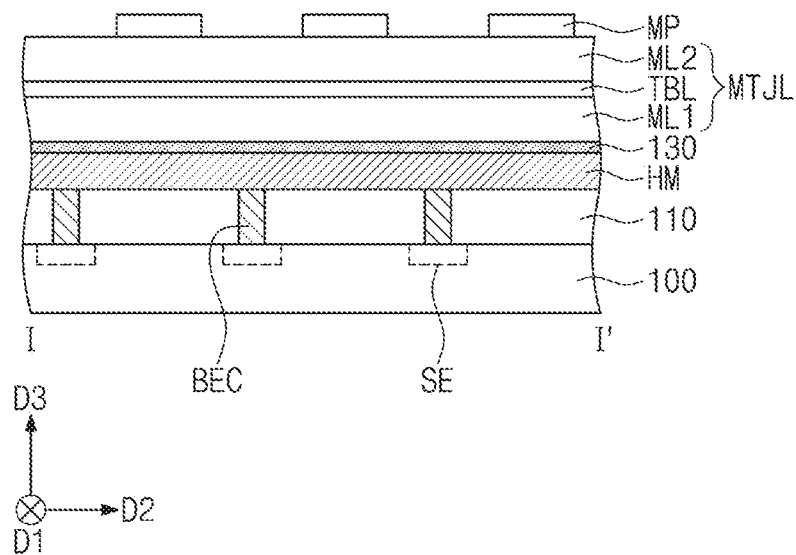
Figure 5C:
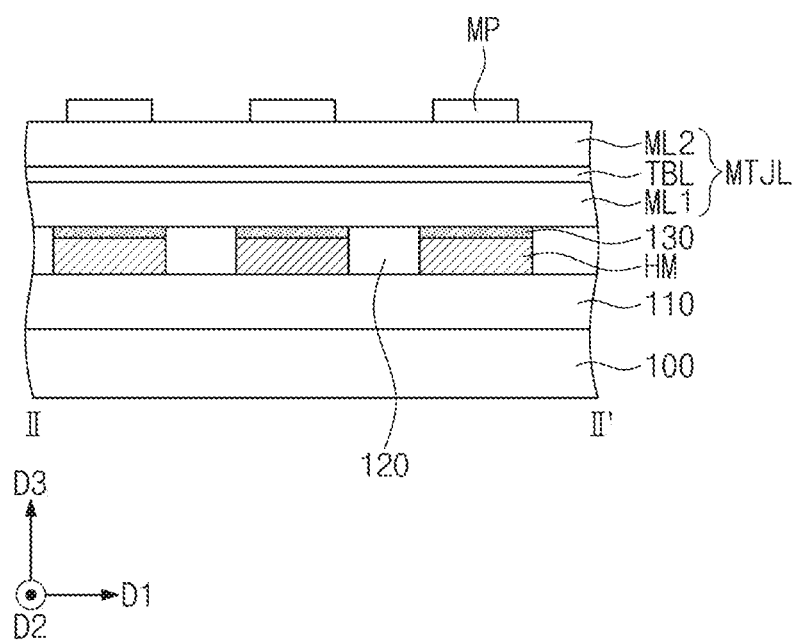
Figure 6A:
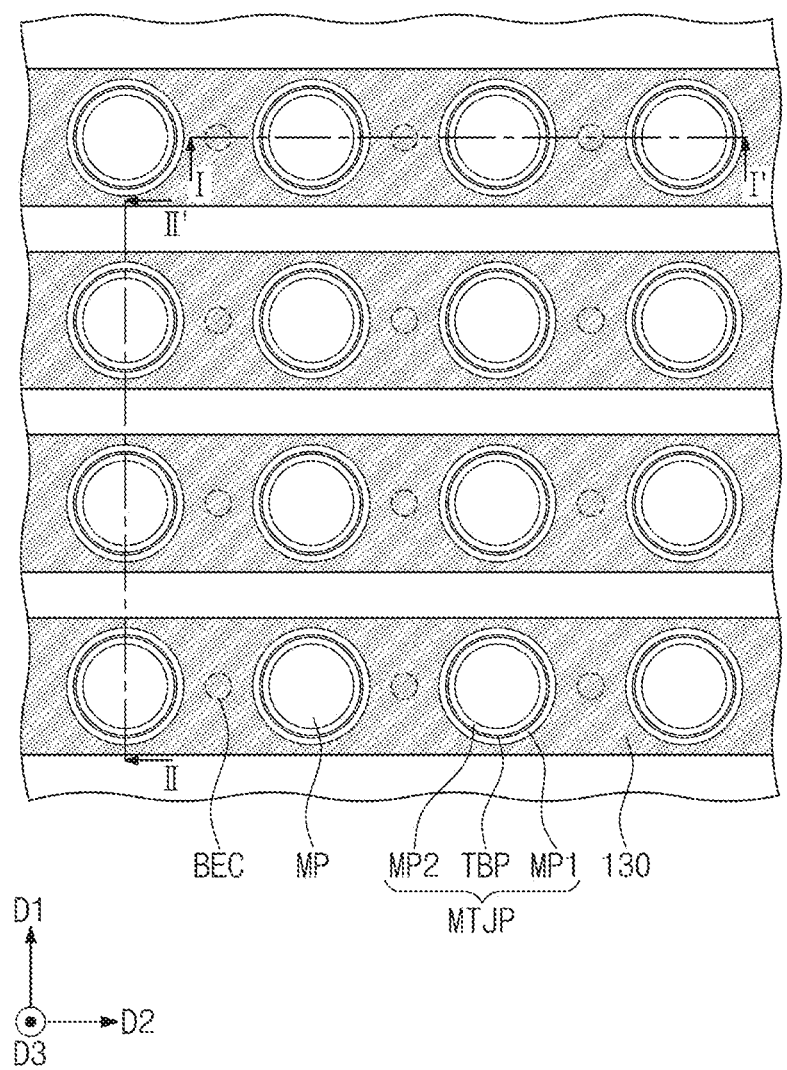
Figure 6B:
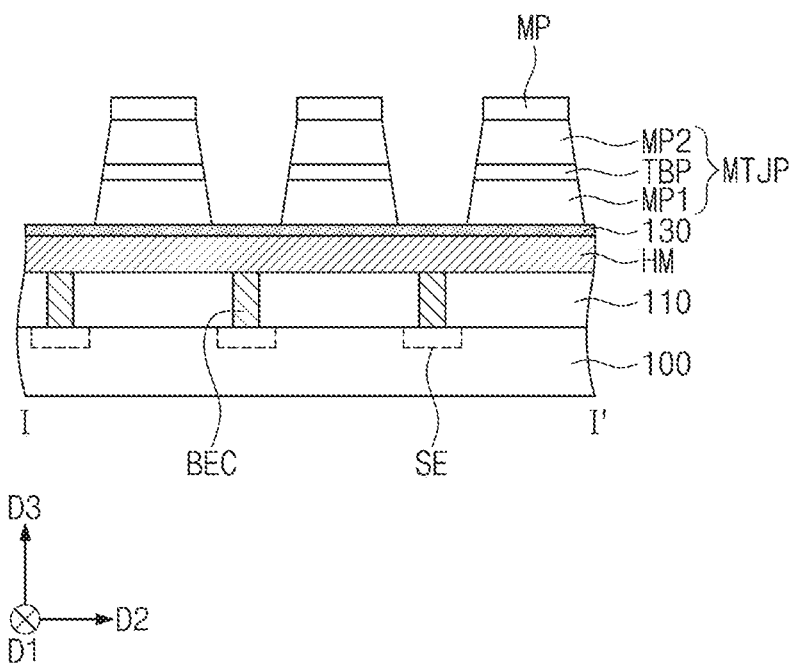
Figure 6C:
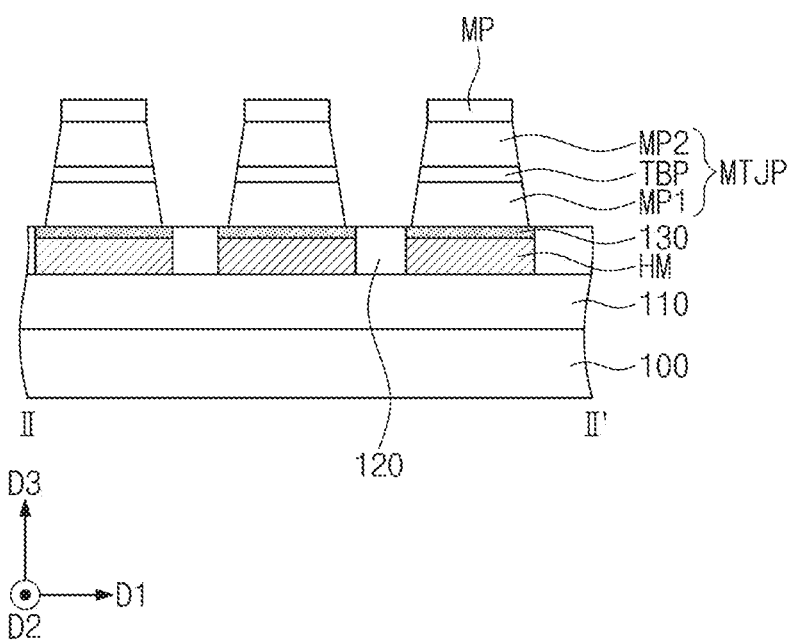

FIGS. 4A, 5A and 6A are plan views illustrating a method of manufacturing a magnetic memory device, according to some embodiments of the inventive concepts. FIGS. 4B, 5B and 6B are cross-sectional views taken along lines I-I' of FIGS. 4A, 5A and 6A, respectively. FIGS. 4C, 5C and 6C are cross-sectional views taken along lines II-II' of FIGS. 4A, 5A and 6A, respectively. A method of manufacturing a magnetic memory device according to some embodiments of the inventive concepts will be described with reference to FIGS. 4A to 6C, 2A, 2B and 2C.

Referring to FIGS. 4A, 4B and 4C, a first insulating pattern 110 and bottom electrode contacts BEC in the first insulating pattern 110 may be formed on a substrate 100. In addition, selection elements SE may be formed on the substrate 100. In some embodiments, the formation of the selection elements SE may include forming a conductive layer on the substrate 100 and patterning the conductive layer. In some embodiments, the selection elements SE may be formed by a printing method using metal paste.

The first insulating pattern 110 may be formed using, for example, a chemical vapor deposition (CVD) process. The first insulating pattern 110 may be formed to have a single-layered structure or a multi-layered structure including a plurality of stacked insulating layers. In some embodiments, the first insulating pattern 110 may be formed to have a multi-layered structure further including a conductive layer or semiconductor layer between the plurality of stacked insulating layers. The formation of the bottom electrode contacts BEC may include patterning the first insulating pattern 110 to form first contact holes, and filling the first contact holes with at least one of a metal, a conductive metal nitride, a semiconductor material doped with dopants, or a metal-semiconductor compound. A top surface of the first insulating pattern 110 including the bottom electrode contacts BEC may be substantially flat.

Metal patterns HM and anti-oxidation layers 130 may be formed on the first insulating pattern 110 and the bottom electrode contacts BEC. First, metal layers may be formed by a deposition process. Different metals may be sequentially deposited to form the metal layers. The metal layers may be formed by, for example, sputtering processes. Thereafter, a patterning process may be performed on the metal layers to form the metal patterns HM and the anti-oxidation layers 130, which extend in the second direction D2. The metal patterns HM may be spaced apart from each other in the first direction D1, and the anti-oxidation layers 130 may be spaced apart from each other in the first direction D1. Each of the metal patterns HM may be electrically connected to a plurality of the bottom electrode contacts BEC. Since the metal pattern HM and the anti-oxidation layer 130 are formed simultaneously through the patterning process, a sidewall HMs of the metal pattern HM may be aligned with a sidewall 130s of the anti-oxidation layer 130. It will be understood that "formed simultaneously" refers to being formed in a same fabrication step, at approximately (but not necessarily exactly) the same time. In some embodiments, the sidewall HMs of the metal pattern HM may be aligned with the sidewall 130s of the anti-oxidation layer 130 in the third direction D3 as illustrated in FIG. 4C.

A second insulating pattern 120 may be formed between the metal patterns HM and between the anti-oxidation layers 130. The second insulating pattern 120 may be formed using, for example, a CVD process. The second insulating pattern 120 may be formed to have a single-layered structure or a multi-layered structure including a plurality of stacked insulating layers. In some embodiments, the second insulating pattern 120 may be formed to have a multi-layered structure further including a conductive layer or semiconductor layer between the plurality of stacked insulating layers. A top surface of the second insulating pattern 120 may be substantially coplanar with a top surface of the anti-oxidation layer 130.

Referring to FIGS. 5A, 5B and 5C, a magnetic tunnel junction layer MTJL may be formed on the second insulating pattern 120 and the anti-oxidation layer 130. The magnetic tunnel junction layer MTJL may be formed by sequentially depositing a first magnetic layer ML1, a tunnel barrier layer TBL and a second magnetic layer ML2. In some embodiments, each of the first magnetic layer ML1, the tunnel barrier layer TBL and the second magnetic layer ML2 may have a multi-layered structure including a plurality of layers. The deposition processes of the first magnetic layer ML1, the tunnel barrier layer TBL and the second magnetic layer ML2 may be performed by, for example, sputtering processes. The tunnel barrier layer TBL may be disposed between the first magnetic layer ML1 and the second magnetic layer ML2. Due to the tunnel barrier layer TBL, the first magnetic layer ML1 and the second magnetic layer ML2 may not be in contact with each other but may be spaced apart from each other. In addition, even though not shown in the drawings, a seed layer may be disposed between the anti-oxidation layer 130 and the first magnetic layer ML1. The seed layer may assist formation of a crystal structure of the first magnetic layer ML1.

Mask patterns MP may be formed on the magnetic tunnel junction layer MTJL. For example, the mask patterns MP may be formed of a photoresist. The mask patterns MP may be formed by a photolithography process. As illustrated in FIG. 5A, a top surface of the mask pattern MP may have a circular shape. However, embodiments of the inventive concepts are not limited thereto. Unlike FIG. 5A, the top surface of the mask pattern MP may have one of other various shapes such as a diamond shape, an elliptical shape, and a rectangular shape.

Referring to FIGS. 6A, 6B and 6C, an etching process may be performed on the magnetic tunnel junction layer MTJL illustrated in FIGS. 5B and 5C by using the mask patterns MP as etch mask, thereby forming magnetic tunnel junction patterns MTJP. The etching process may be performed through, for example, a dry etching process. For example, the etching process may be performed by an ion beam etching (IBE) process or a reactive ion etching (ME) process. The IBE process or the RIE process may be anisotropically performed. A mean free path of particles may be increased as a pressure of an environment of the etching process decreases, and thus anisotropy of the etching process may be increased. When the anisotropy is increased, an undercut phenomenon in which a portion under the mask pattern MP is etched may be reduced. Due to the anisotropic etching process, a width of the magnetic tunnel junction pattern MTJP in the first direction D1 and/or the second direction D2 may decrease as a distance from the substrate 100 in the third direction D3 increases. However, embodiments of the inventive concepts are not limited thereto. Unlike FIGS. 6B and 6C, the width of the magnetic tunnel junction pattern MTJP in the first direction D1 and/or the second direction D2 may be substantially uniform as a distance from the substrate 100 in the third direction D3 increases. The magnetic tunnel junction patterns MTJP may be spaced apart from each other by the etching process and may constitute a magnetic tunnel junction array.

Unlike FIGS. 6B and 6C, a portion of the materials of the magnetic tunnel junction patterns MTJP may be re-sputtered by the etching process. The re-sputtered materials may be formed on sidewalls of the magnetic tunnel junction patterns MTJP, the top surface of the second insulating pattern 120, and the top surface of the anti-oxidation layer 130. In particular, the materials re-sputtered on the sidewall of the magnetic tunnel junction pattern MTJP may electrically short the first magnetic pattern MP1 and the second magnetic pattern MP2. Thus, accuracy and/or speeds of write and read operations of the magnetic memory device may be deteriorated.

Referring again to FIGS. 2A, 2B and 2C, portions of the magnetic tunnel junction patterns MTJP may be oxidized to form oxide layers 150. The oxide layer 150 may be formed to cover the sidewall SW of the magnetic tunnel junction pattern MTJP. The sidewalls of the first magnetic pattern MP1, the tunnel barrier pattern TBP and the second magnetic pattern MP2 of the magnetic tunnel junction pattern MTJP may be oxidized by a certain thickness, and thus the first and second magnetic patterns MP1 and MP2 may be electrically separated from each other. In other words, the materials re-sputtered in the etching process may be oxidized, and thus characteristics of the magnetic memory device may be improved. The oxide layer 150 may be formed by an oxidation process. For example, the oxide layer 150 may be formed by a wet oxidation process (e.g., an anodizing process) or a dry oxidation process. In the oxidation process, oxidation and damage of the metal pattern HM may be reduced or possibly prevented by the anti-oxidation layer 130. In more detail, since a metal component of the anti-oxidation layer 130 is oxidized, oxidation of the metal pattern HM may be reduced or possibly prevented. After the oxidation process, the mask patterns MP illustrated in FIGS. 6A to 6C may be removed.

A third insulating pattern 170 may be formed on the anti-oxidation layer 130 and the oxide layer 150. The third insulating pattern 170 may be formed to fill (e.g., partially fill or completely fill) a space formed by the oxide layers 150 covering the magnetic tunnel junction patterns MTJP and a portion of the anti-oxidation layer 130 on which the magnetic tunnel junction patterns MTJP are not formed. The third insulating pattern 170 may be formed using a CVD process. The third insulating pattern 170 may be formed to have a single-layered structure or a multi-layered structure including a plurality of stacked insulating layers. In some embodiments, the third insulating pattern 170 may be formed to have a multi-layered structure further including a conductive layer or semiconductor layer between the plurality of stacked insulating layers. The third insulating pattern 170 may be formed in such a way that its top surface is substantially coplanar with top surfaces of the magnetic tunnel junction patterns MTJP. In other words, a surface including the top surfaces of the third insulating pattern 170 and the magnetic tunnel junction patterns MTJP may be substantially flat. However, embodiments of the inventive concepts are not limited thereto. In some embodiments, unlike FIGS. 2B and 2C, the third insulating pattern 170 may be formed to cover portions of the top surfaces of the magnetic tunnel junction patterns MTJP.

Unlike FIGS. 2A to 2C, top electrode contacts or top electrodes may be formed to be in contact with the magnetic tunnel junction patterns MTJP. The formation of the top electrode contacts may include patterning an insulating layer to form second contact holes, and filling the second contact holes with at least one of a metal, a conductive metal nitride, a semiconductor material doped with dopants, or a metal-semiconductor compound. The top electrode contact or the top electrode may be electrically connected to the bit line BL.

Figure 7A:
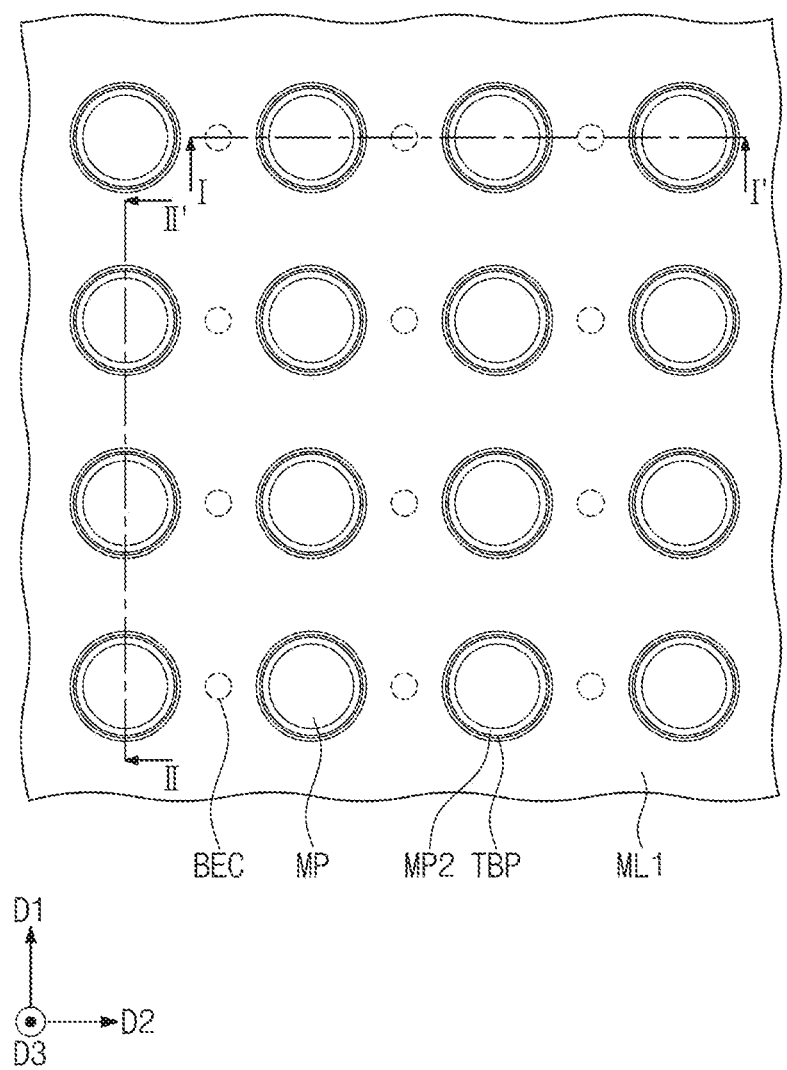
Figure 7B:
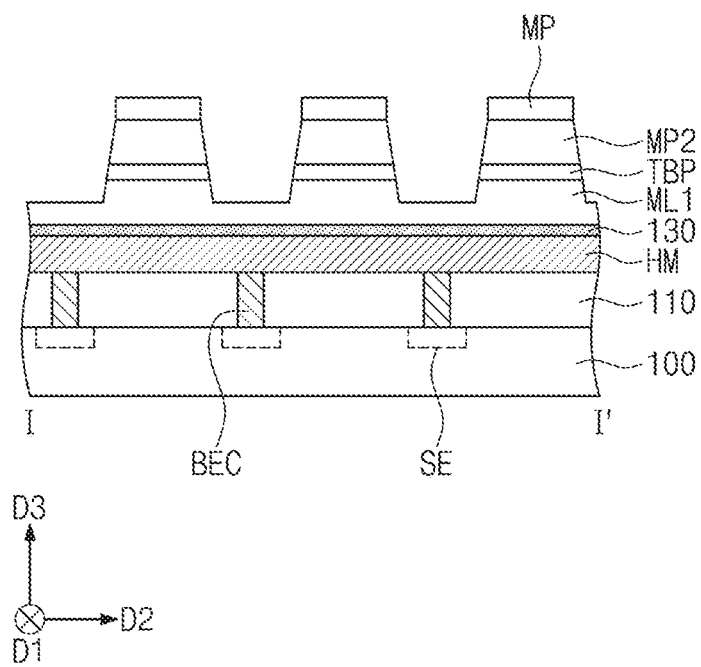
Figure 7C:
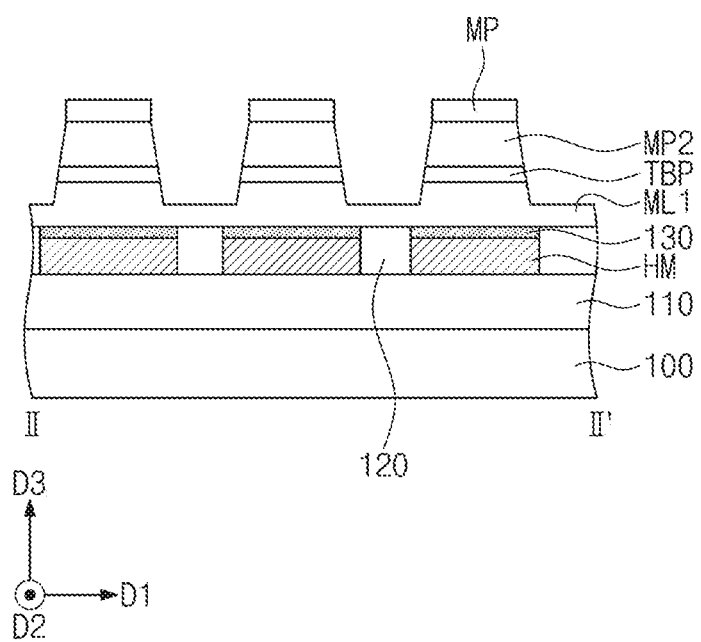

FIG. 7A is a plan view illustrating a method of manufacturing a magnetic memory device according to some embodiments of the inventive concepts. FIGS. 7B and 7C are cross-sectional views taken along lines I-I' and II-II' of FIG. 7A, respectively. A method of manufacturing a magnetic memory device according to some embodiments of the inventive concepts will be described with reference to FIGS. 7A, 7B, 7C, 3A, 3B and 3C. Hereinafter, the descriptions of the same components and/or features as in the embodiments of FIGS. 4A to 6C may be omitted for the purpose of ease and convenience in explanation.

Referring to FIGS. 7A, 7B and 7C, the tunnel barrier pattern TBP and the second magnetic pattern MP2 may be formed through an etching process. For example, the etching process may be performed by an ion beam etching (IBE) process or a reactive ion etching (RIE) process. A portion of the first magnetic layer ML1 may be etched by the etching process. In other words, the first magnetic layer ML1 may not be completely separated between the second magnetic patterns MP2. The portion of the first magnetic layer ML1 may be etched to form a recess region in an upper portion of the first magnetic layer ML1. Due to the anisotropy of the etching process, widths of the tunnel barrier pattern TBP and the second magnetic pattern MP2 in the first direction D1 and/or the second direction D2 may decrease as a distance from the substrate 100 in the third direction D3 increases. However, embodiments of the inventive concepts are not limited thereto. Unlike FIGS. 7B and 7C, the widths of the tunnel barrier pattern TBP and the second magnetic pattern MP2 in the first direction D1 and/or the second direction D2 may be substantially uniform as a distance from the substrate 100 in the third direction D3 increases.

Unlike FIGS. 7B and 7C, portions of the materials of the tunnel barrier pattern TBP and the second magnetic pattern MP2 may be re-sputtered by the etching process. The re-sputtered materials may be formed on sidewalls of the tunnel barrier pattern TBP and the second magnetic pattern MP2 and an inner surface of the recess region of the first magnetic layer ML1 between the tunnel barrier patterns TBP. In particular, the materials re-sputtered on the sidewalls of the tunnel barrier pattern TBP and the second magnetic pattern MP2 and an inner sidewall of the recess region may electrically short the second magnetic pattern MP2 and the first magnetic layer ML1. Thus, accuracy and/or speeds of write and read operations of the magnetic memory device may be deteriorated.

Referring again to FIGS. 3A, 3B and 3C, an oxide layer 160 may be formed by oxidizing portions of the tunnel barrier pattern TBP and the second magnetic pattern MP2 and a portion of the first magnetic layer ML1 of FIGS. 7A to 7C. The portion of the first magnetic layer ML1 of FIGS. 7A to 7C may be oxidized to form a first portion 161 of the oxide layer 160. The portions of the tunnel barrier pattern TBP and the second magnetic pattern MP2 and the materials re-sputtered in the etching process may be oxidized to form a second portion 162 of the oxide layer 160. First magnetic patterns MP1 may be formed by the formation of the oxide layer 160. In other words, magnetic tunnel junction patterns MTJP, each of which includes the first magnetic pattern MP1, the tunnel barrier pattern TBP, and the second magnetic pattern MP2, may be formed. The sidewalls of the tunnel barrier pattern TBP and the second magnetic pattern MP2 may be oxidized by a certain thickness, and thus the first and second magnetic patterns MP1 and MP2 may be electrically separated from each other. In other words, the materials re-sputtered in the etching process may be oxidized, and thus characteristics of the magnetic memory device may be improved. The oxide layer 160 may be formed by an oxidation process. For example, the oxide layer 160 may be formed by a wet oxidation process (e.g., an anodizing process) or a dry oxidation process. In the oxidation process, oxidation and damage of the metal pattern HM may be reduced or possibly prevented by the anti-oxidation layer 130. In more detail, since a metal component of the anti-oxidation layer 130 is oxidized, oxidation of the metal pattern HM may be reduced or possibly prevented. After the oxidation process, the mask patterns MP illustrated in FIGS. 7A to 7C may be removed. In some embodiments, the first portion 161 of the oxide layer 160 may include a metal element included in the first magnetic layer ML1.

A third insulating pattern 180 may be formed on the oxide layer 160. The third insulating pattern 180 may be formed to fill (e.g., partially fill or completely fill) a recess region RC defined by the first and second portions 161 and 162 of the oxide layer 160. The third insulating pattern 180 may be formed in such a way that its top surface is substantially coplanar with a top surface of the second portion 162 of the oxide layer 160 and top surfaces of the magnetic tunnel junction patterns MTJP. In other words, a combined surface including the top surfaces of the magnetic tunnel junction patterns MTJP, the top surface of the second portion 162 of the oxide layer 160 and the top surface of the third insulating pattern 180 may be substantially flat. However, embodiments of the inventive concepts are not limited thereto. In certain embodiments, unlike FIGS. 3B and 3C, the third insulating pattern 180 may be formed to cover portions of the top surfaces of the magnetic tunnel junction patterns MTJP.

Figure 8A:
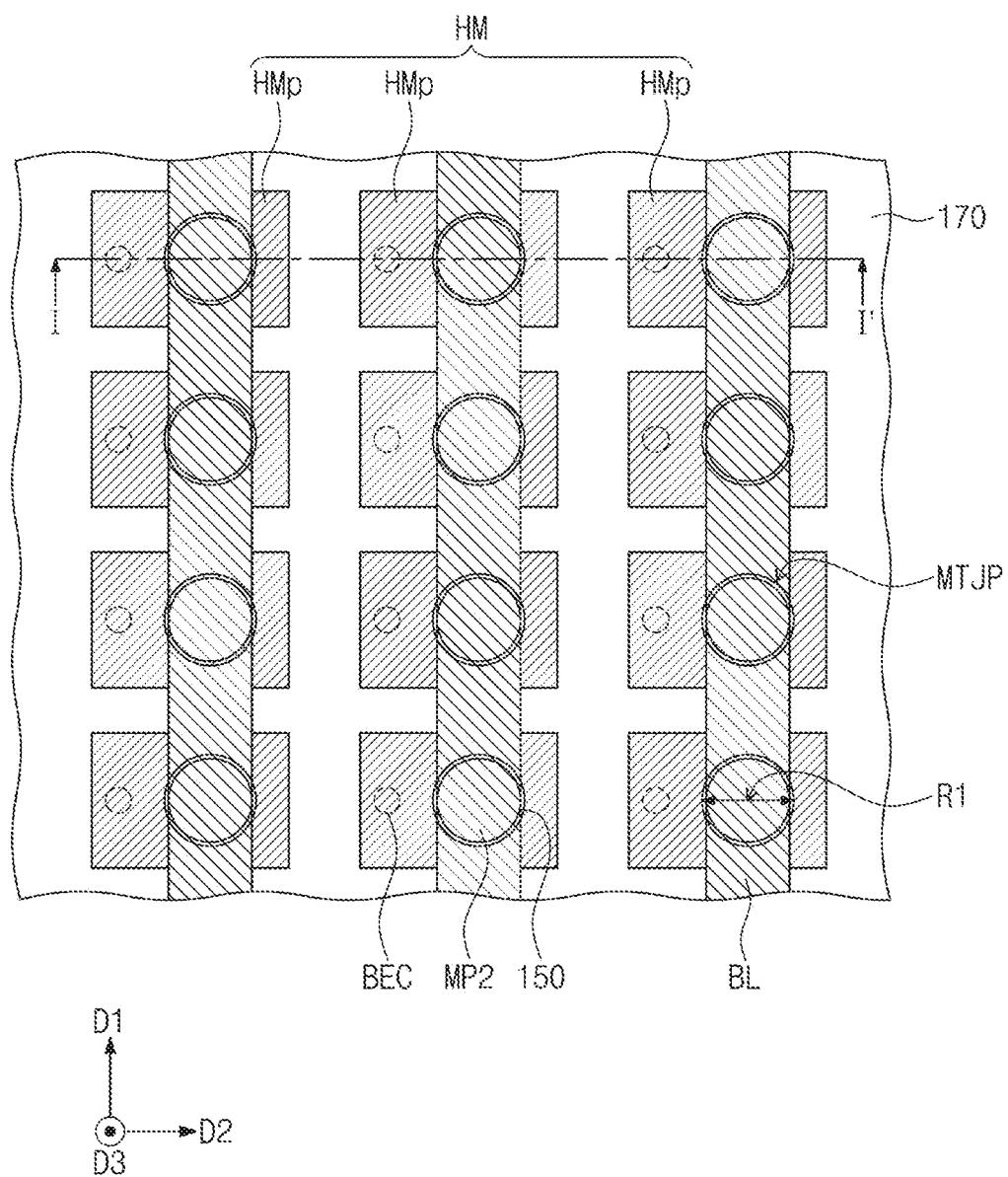
Figure 8B:
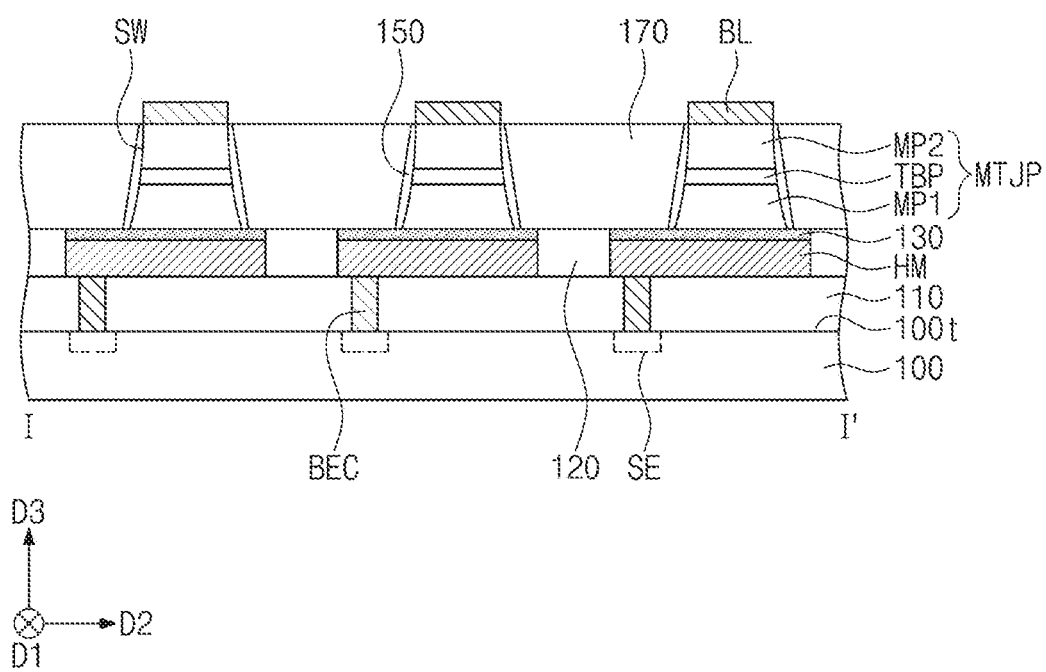
Figure 9A:
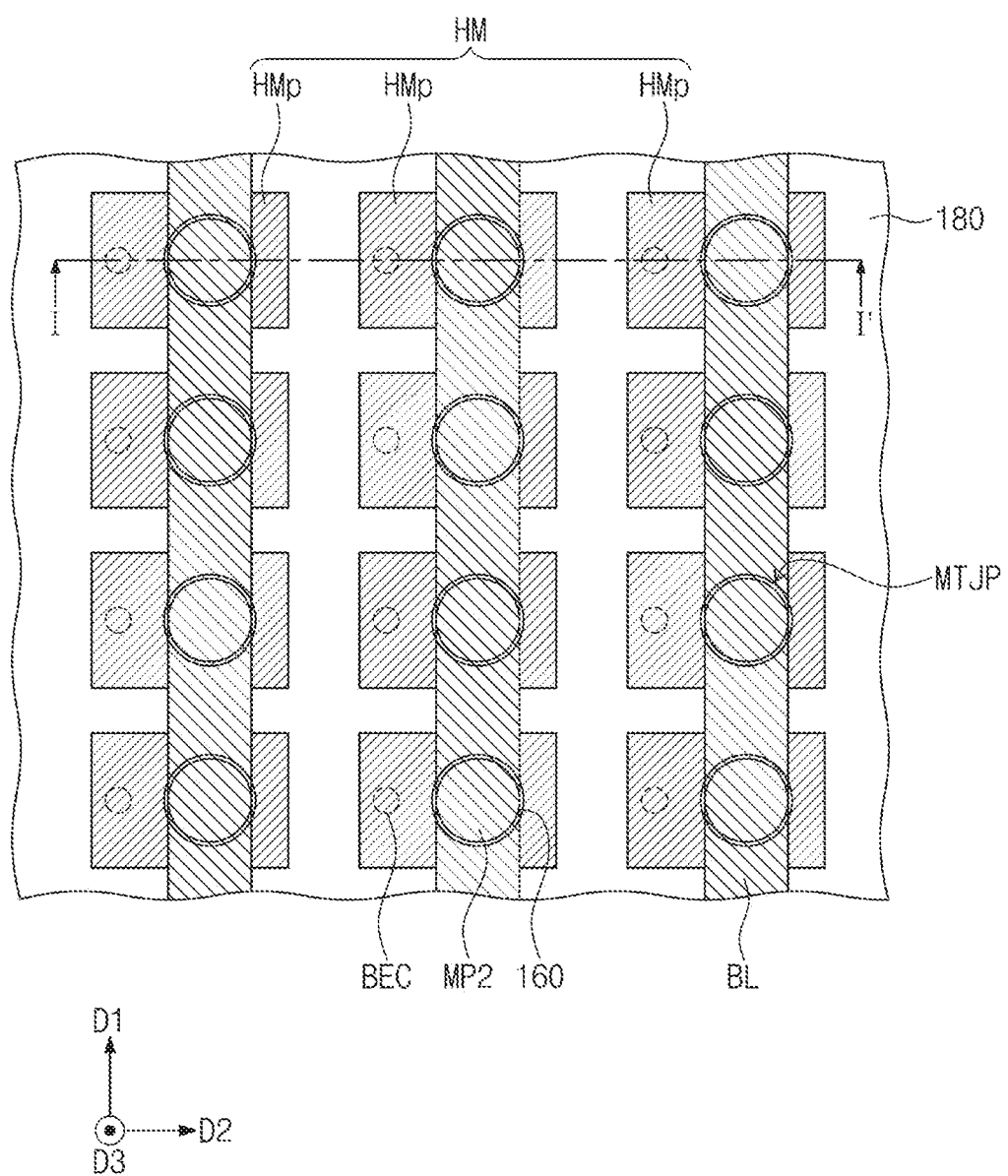
Figure 9B:
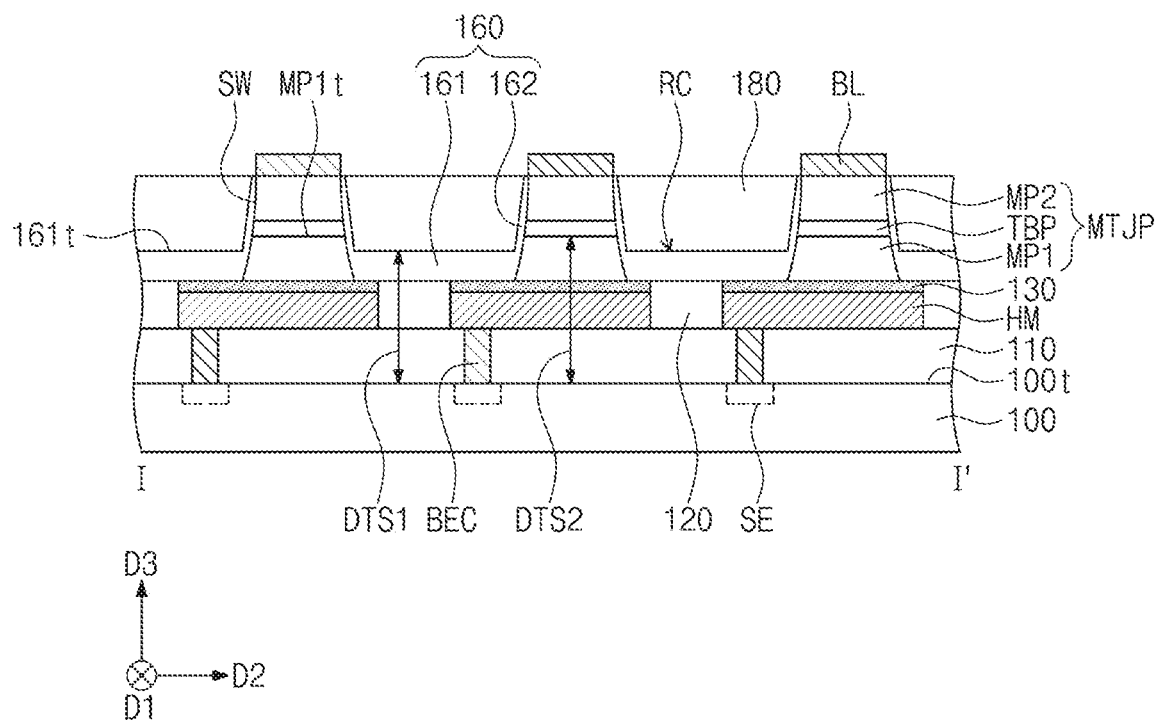

FIGS. 8A and 9A are plan views illustrating magnetic memory devices according to some embodiments of the inventive concepts. FIGS. 8B and 9B are cross-sectional views taken along lines I-I' of FIGS. 8A and 9A, respectively. Hereinafter, the descriptions of the same components and/or features as in the embodiments of FIGS. 2A to 3C may be omitted for the purpose of ease and convenience in explanation.

Referring to FIGS. 8A and 8B, a metal pattern HM, a second insulating pattern 120 and an anti-oxidation layer 130 may be provided on the first insulating pattern 110 and the bottom electrode contacts BEC. For example, the metal pattern HM may extend in the second direction D2 and may be electrically connected to one of the bottom electrode contacts BEC. The metal pattern HM may include metal pattern portions HMp spaced apart from each other in the first direction D1 and the second direction D2. The second insulating pattern 120 may be provided in a space between the metal pattern portions HMp. The magnetic tunnel junction patterns MTJP may be provided on the metal pattern portions HMp, respectively. In other words, one of the metal pattern portions HMp may be electrically connected to one of the magnetic tunnel junction patterns MTJP, which is provided on a top surface of the one metal pattern portion HMp. One of the metal pattern portions HMp and one of the magnetic tunnel junction patterns MTJP provided on the top surface thereof may constitute a unit memory element for storing data. The anti-oxidation layer 130 may be provided between the metal pattern HM and the magnetic tunnel junction patterns MTJP.

Referring to FIGS. 9A and 9B, the metal pattern HM may be provided on the first insulating pattern 110 and the bottom electrode contacts BEC. Hereinafter, the descriptions of the same components and/or features as in the embodiments of FIGS. 8A and 8B may be omitted for the purpose of ease and convenience in explanation. An oxide layer 160 may include a first portion 161, a second portion 162, and a recess region RC. The recess region RC of the oxide layer 160 may be defined by the first portion 161 and the second portion 162. The first portion 161 of the oxide layer 160 may be provided on the second insulating pattern 120 and the anti-oxidation layer 130. The second portion 162 of the oxide layer 160 may be provided on the sidewalls SW of the magnetic tunnel junction patterns MTJP. A third insulating pattern 180 may be provided on the oxide layer 160. The third insulating pattern 180 may fill the recess region RC of the oxide layer 160.

In the magnetic memory devices described with reference to FIGS. 8A to 9B, the metal pattern portions HMp may be spaced apart from each other in the first and second directions D1 and D2 and the magnetic tunnel junction patterns MTJP may be provided on the metal pattern portions HMp, respectively. Except for these features, other components and features of the magnetic memory devices of FIGS. 8A to 9B may be substantially the same as or similar to corresponding components and features of the magnetic memory devices of FIGS. 2A to 3C.

According to embodiments of the inventive concepts, it may be possible to reduce or possibly prevent the metal pattern adjacent to the magnetic tunnel junction patterns from being damaged in the patterning process for forming the magnetic tunnel junction patterns.

In addition, according to embodiments of the inventive concepts, it may be possible to reduce or possibly prevent an electrical short between the magnetic tunnel junction patterns and between the magnetic patterns of each of the magnetic tunnel junction patterns. Thus, electrical characteristics and reliability of the spin-orbit torque-based magnetic memory device may be improved.

While the inventive concepts have been described with reference to example embodiments, it will be apparent to those skilled in the art that various changes and modifications may be made without departing from the scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
   a substrate;
   a metal pattern extending in a first direction on the substrate;
   a magnetic tunnel junction pattern on the metal pattern;
   an oxide layer extending on a sidewall of the magnetic tunnel junction pattern; and
   an anti-oxidation layer between the metal pattern and the magnetic tunnel junction pattern,
   wherein the magnetic tunnel junction pattern comprises a first magnetic pattern, a tunnel barrier pattern, and a second magnetic pattern, and
   wherein the magnetic tunnel junction pattern and the oxide layer surrounding the magnetic tunnel junction pattern form a pillar shape.

2. The magnetic memory device of claim 1, wherein a thickness of the oxide layer on the sidewall of the magnetic tunnel unction pattern in a horizontal direction is smaller than a diameter of a top surface of the magnetic tunnel junction pattern.

3. The magnetic memory device of claim 2, wherein the oxide layer comprises:
   a first portion on a top surface of the anti-oxidation layer; and
   a second portion extending on the sidewall of the magnetic tunnel junction pattern, wherein the first portion and the second portion define a recess region of the oxide layer.

4. The magnetic memory device of claim 3, wherein a top surface of the first portion is spaced apart from a top surface of the substrate by a first distance, and a top surface of the first magnetic pattern is spaced apart from the top surface of the substrate by a second distance that is greater than the first distance.

5. The magnetic memory device of claim 3, further comprising:
   an insulating pattern in the recess region.

6. The magnetic memory device of claim 3, wherein the first portion of the oxide layer comprises a metal element that the first magnetic pattern comprises.

7. The magnetic memory device of claim 1, wherein the anti-oxidation layer comprises at least one of niobium (Nb) or titanium (Ti).

8. The magnetic memory device of claim 1, wherein the anti-oxidation layer extends in the first direction.

9. The magnetic memory device of claim 1, wherein a thickness of the anti-oxidation layer is thinner than a thickness of the metal pattern.

10. The magnetic memory device of claim 1, wherein a widest width of the metal pattern in a second direction that is perpendicular to the first direction is greater than a widest width of the magnetic tunnel junction pattern.

11. The magnetic memory device of claim 1, wherein the metal pattern comprises a plurality of metal pattern portions spaced apart from each other in the first direction and a second direction that is perpendicular to the first direction,
   wherein the magnetic tunnel junction pattern comprises a plurality of magnetic tunnel junction patterns, and
   wherein each of the plurality of metal pattern portions is electrically connected to a respective one of the plurality of magnetic tunnel junction patterns.

12. A magnetic memory device comprising:
   a substrate;
   a metal pattern extending in a first direction on the substrate;

a plurality of magnetic tunnel junction patterns, each of the plurality of magnetic tunnel junction patterns comprising a respective one of a plurality of first magnetic patterns, a respective one of a plurality of tunnel barrier patterns and a respective one of a plurality of second magnetic patterns; and an anti-oxidation layer between the metal pattern and the plurality of first magnetic patterns, wherein the plurality of magnetic tunnel junction patterns are spaced apart from each other, and wherein the anti-oxidation layer extends in the first direction and is electrically connected to the plurality of the first magnetic patterns.

13. The magnetic memory device of claim 12, further comprising:

an oxide layer extending on sidewalls of the magnetic tunnel junction patterns.

14. The magnetic memory device of claim 13, wherein the oxide layer comprises:

a first portion on a top surface of the anti-oxidation layer; and a second portion extending on the sidewalls of the magnetic tunnel junction patterns, wherein the first portion and the second portion define a recess region of the oxide layer.

15. The magnetic memory device of claim 14, wherein a top surface of the first portion is spaced apart from a top surface of the substrate by a first distance, and a top surface of a first of the plurality of first magnetic patterns is spaced apart from the top surface of the substrate by a second distance that is greater than the first distance.

16. The magnetic memory device of claim 14, wherein the first portion of the oxide layer comprises a metal element that each of the plurality of first magnetic patterns comprises.

17. The magnetic memory device of claim 12, wherein a sidewall of the metal pattern is vertically aligned with a sidewall of the anti-oxidation layer.

18. The magnetic memory device of claim 12, wherein a widest width of the metal pattern in a second direction that is perpendicular to the first direction is greater than a widest width of one of the magnetic tunnel junction patterns.

19. The magnetic memory device of claim 12, wherein a thickness of the anti-oxidation layer is thinner than a thickness of the metal pattern.

20. The magnetic memory device of claim 12, wherein the metal pattern comprises a plurality of metal pattern portions spaced apart from each other in the first direction and a second direction that is perpendicular to the first direction, and wherein each of the plurality of metal pattern portions is electrically connected to a respective one of the plurality of magnetic tunnel junction patterns.

* * * * *